United States Patent
Yang

(10) Patent No.: US 11,515,362 B2
(45) Date of Patent: Nov. 29, 2022

(54) DISPLAY PANEL AND DISPLAY DEVICE

(71) Applicant: WuHan TianMa Micro-electronics CO., LTD., Wuhan (CN)

(72) Inventor: Xingxing Yang, Wuhan (CN)

(73) Assignee: WuHan TianMa Micro-electronics CO., LTD, Wuhan (CN)

( * ) Notice: Subject to any disclaimer, the term of this patent is extended or adjusted under 35 U.S.C. 154(b) by 0 days.

(21) Appl. No.: 17/084,416

(22) Filed: Oct. 29, 2020

(65) Prior Publication Data
US 2021/0050389 A1    Feb. 18, 2021

(30) Foreign Application Priority Data
Aug. 31, 2020    (CN) .......................... 202010901323.3

(51) Int. Cl.
*H01L 27/32* (2006.01)
*H01L 27/12* (2006.01)

(52) U.S. Cl.
CPC ...... *H01L 27/3218* (2013.01); *H01L 27/1218* (2013.01); *H01L 27/3234* (2013.01)

(58) Field of Classification Search
CPC ............. H01L 27/3218; H01L 27/3234; H01L 27/3227
See application file for complete search history.

(56) References Cited

U.S. PATENT DOCUMENTS

2020/0395418 A1* 12/2020 Han ..................... H01L 27/3246

FOREIGN PATENT DOCUMENTS

| CN | 110071161 A | 7/2019 |
| CN | 110570774 A | 12/2019 |

* cited by examiner

*Primary Examiner* — Jesse Y Miyoshi
(74) *Attorney, Agent, or Firm* — Christensen O'Connor Johnson Kindness PLLC

(57) ABSTRACT

A display panel and a display device are provided. The display panel has a display area including a conventional display region and a translucent display region; and a non-display area. First sub-pixels, second sub-pixels and third sub-pixels are provided in the conventional display region, the first sub-pixels are arranged in a first density, and the second and third sub-pixels are arranged in a second density. Fourth sub-pixels, fifth sub-pixels and sixth sub-pixels are provided in the translucent display region, the fourth sub-pixel has a same color as the first sub-pixel, the fifth sub-pixel has a same color as the second sub-pixel, and the sixth sub-pixel has a same color as the third sub-pixel. The fourth sub-pixels are arranged in a third density equal to the first density, the fifth and sixth sub-pixels are arranged in a fourth density. The second density is greater than the fourth density.

20 Claims, 17 Drawing Sheets

DISPLAY PANEL AND DISPLAY DEVICE

CROSS-REFERENCE TO RELATED APPLICATIONS

The present application claims priority to Chinese Patent Application No. 202010901323.3, filed on Aug. 31, 2020, the content of which is incorporated herein by reference in its entirety.

TECHNICAL FIELD

The present application relates to the field of display technology, and particularly, to a display panel and a display device.

BACKGROUND

With the advent of the "full-screen" era, a screen-to-body ratio of display devices of products such as mobile phones attracts more and more attention. The screen-to-body ratio of the display panel is restricted by a front camera and a light sensor, as it is necessary to provide a non-display slot or hole in the display panel for arranging the light sensor (such as the camera) therein. Thus, it is impossible to reach an actual full-screen display. In this regard, it is desired to develop a display panel that is able to simultaneously display and transmit light, and in which a light sensor can be arranged under a display area.

SUMMARY

In one aspect, the present disclosure provides a display panel, the display panel has a display area and a non-display area surrounding the display area, and the display area includes a conventional display area and a translucent display area. The display panel includes a plurality of first sub-pixels, a plurality of second sub-pixels, a plurality of third sub-pixels, a plurality of fourth sub-pixels, a plurality of fifth sub-pixels and a plurality of sixth sub-pixels. The plurality of first sub-pixels, the plurality of second sub-pixels and the plurality of third sub-pixels are provided in the conventional display region, the plurality of first sub-pixels is arranged in a first density, the plurality of second sub-pixels is arranged in a second density, and the plurality of third sub-pixels is arranged in the second density. The plurality of fourth sub-pixels, the plurality of fifth sub-pixels and the plurality of sixth sub-pixels are provided in the translucent display region, each of the plurality of fourth sub-pixels has a same color as each of the plurality of first sub-pixels, each of the plurality of fifth sub-pixels has a same color as each of the plurality of second sub-pixels, and each of the plurality of sixth sub-pixels has a same color as each of the plurality of third sub-pixels, the plurality of fourth sub-pixels is arranged in a third density, the plurality of fifth sub-pixels is arranged in a fourth density, and the plurality of sixth sub-pixels is arranged in the fourth density. The first density is equal to the third density, and the second density is greater than the fourth density.

In another aspect, the present disclosure provides a display device including the above display panel.

BRIEF DESCRIPTION OF DRAWINGS

In order to more clearly explain technical solutions of embodiments of the present disclosure, the drawings of the embodiments are briefly described as below. The drawings described below are merely some of the embodiments of the present disclosure. On basis of these drawings, those skilled in the art can obtain other drawings.

DESCRIPTION OF EMBODIMENTS

Figure 1:
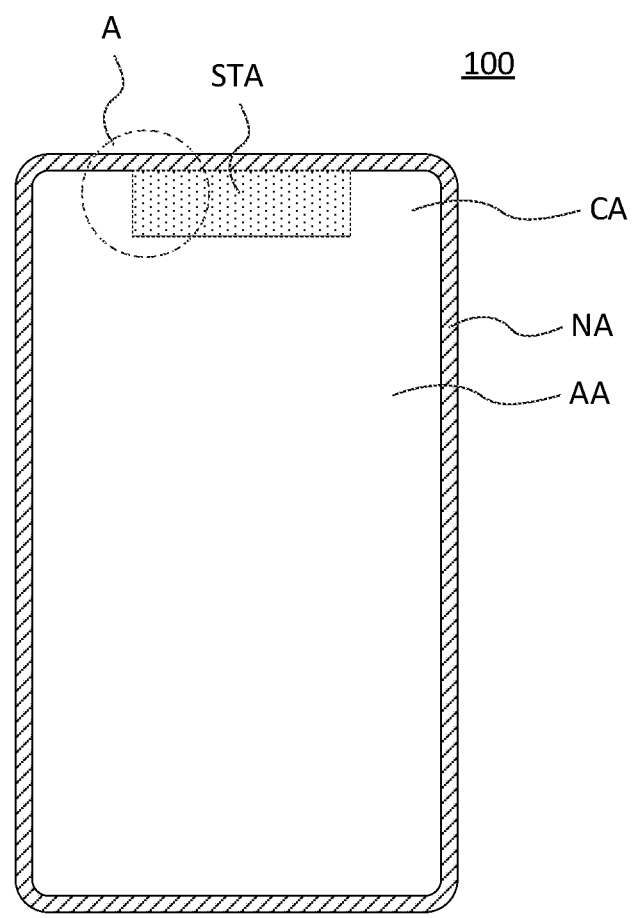
FIG. 1 is a schematic diagram of a display panel according to an embodiment of the present disclosure.

For better understanding of the technical solution of the present disclosure, the embodiments of the present disclosure are described in detail as below.

It should be understood that the embodiments described below are merely some of, rather than all of the embodiments of the present disclosure. Based on the embodiments described in the present disclosure, all other embodiments obtained by those skilled in the art shall fall within the scope of protection of the present disclosure.

The terms used in the embodiments of the present disclosure are merely for the purpose of describing specific embodiments, but not intended to limit the present disclosure. The singular forms of "a", "an" and "the" used in the embodiments of the present disclosure and the appended claims are also intended to indicate plural forms, unless clearly indicating others.

It should be understood that the term "and/or" used herein merely indicates a relationship describing associated objects, indicating three possible relationships. For example, A and/or B can indicate: A alone, A and B, or B alone. In addition, the character "/" in this description generally means that the associated objects are in an "or" relationship.

It should be understood that, although the terms first, second, third, etc. in the embodiments of the present disclosure are used to describe sub-pixels, these sub-pixels should not be limited to these terms, and these terms are only used to distinguish the sub-pixels from each other. For example, without departing from the scope of the embodiments of the present disclosure, the first sub-pixel can also be referred to as the sub-pixel, and similarly, the second sub-pixel can also be referred to as the first sub-pixel.

Depending on the context, the word "if" as used herein can be interpreted as "when", "while" or "in response to determination" or "in response to detection". Depending on the context, the word "if the described condition or event is determined" or "if the described condition or event is detected" can be interpreted as "when the described condition or event is determined" or "in response to determination (of the described condition or event)"; or "when the described condition or event is detected" or "in response to detection of the described condition or event".

The specific structure of the display panel 100 is described in detail in the following embodiments. The display device shown in the figure is merely for the purpose of illustration, and the display device can be any electronic device having a display function, such as a mobile phone, a tablet computer, a notebook computer, an electronic paper book, or a television.

In the related art, holes or slots provided in the display panel for accommodating a light sensor therein affects an integrity of the display area and also reduces a screen-to-body ratio. A display panel is proposed, in which the light sensor can be arranged under the display area and which can display. The display panel is provided with a conventional display region, and a translucent display region that has a relatively high transmittance, and thus the light sensor can be disposed under the translucent display region. However, in an organic light-emitting diode (OLED) display panel, pixels and pixel driving circuits that are configured to drive the pixels are opaque. In order to increase the transmittance of the translucent display region, it is desired to reduce a density of the pixels in the translucent display region, which will reduce a display fineness (resolution) in the translucent display region. Thus, a display effect of the translucent display region cannot be guaranteed.

Figure 2:
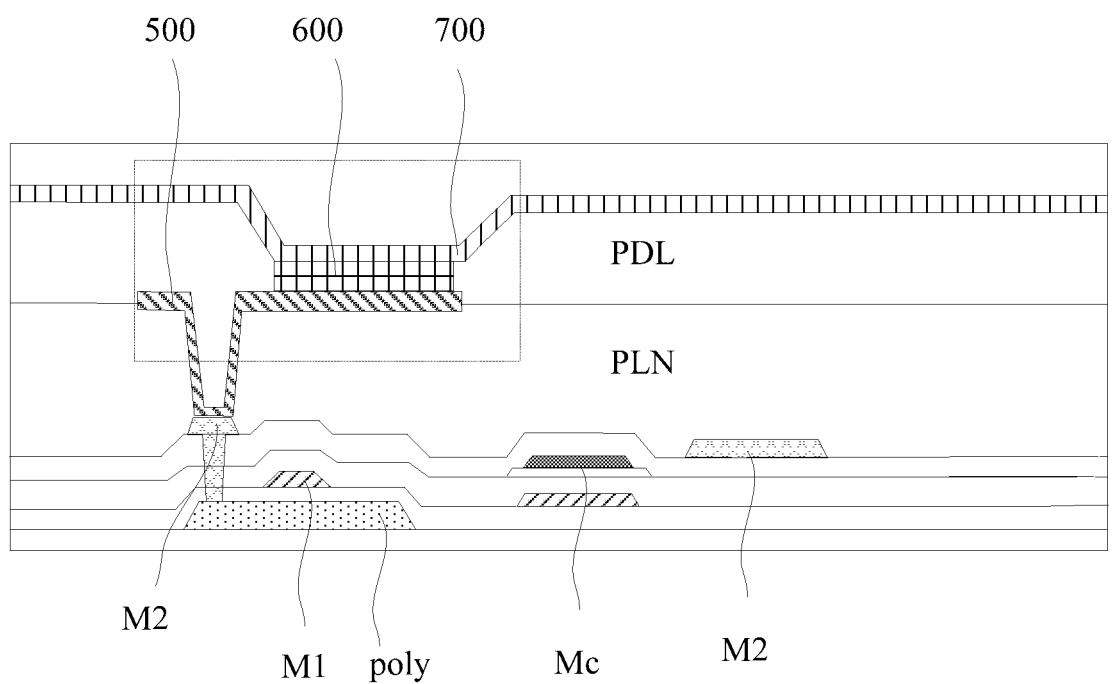
FIG. 2 is a cross-sectional view of a display panel according to an embodiment of the present disclosure.
Figure 3:
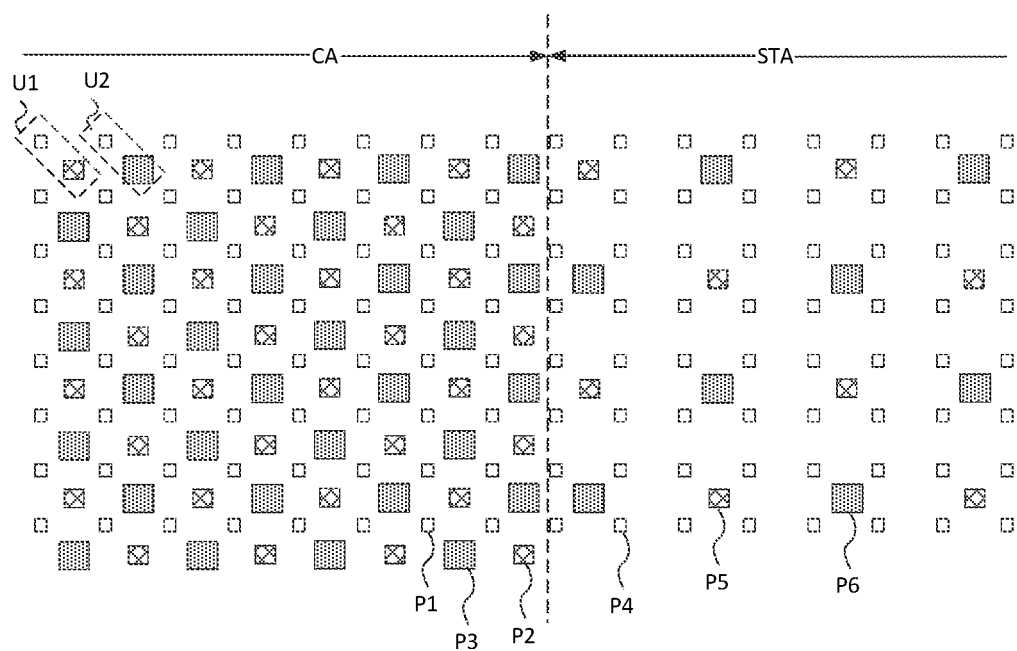
FIG. 3 is a partially enlarged schematic view of a region A shown in FIG. 1 according to an embodiment.

FIG. 1 is a schematic diagram of a display panel according to an embodiment of the present disclosure, FIG. 2 is a cross-sectional view of a display panel according to an embodiment of the present disclosure, and FIG. 3 is a partially enlarged schematic view of a region A shown in FIG. 1. Referring to FIG. 1, FIG. 2 and FIG. 3, the display panel 100 provided by the present disclosure has a display area AA and a non-display area NA surrounding the display area AA, and the display area AA includes a conventional display region CA and a translucent display region STA. First sub-pixels P1 are provided in the conventional display region in a first density, second sub-pixels P2 are provided in the conventional display region in a second density, third sub-pixels P3 are provided in the conventional display region in the second density. Fourth sub-pixels P4 are provided in the translucent display region STA in a third density, fifth sub-pixels P5 are provided in the translucent display region STA in a fourth density, and sixth sub-pixels P6 are provided in the translucent display region STA in the fourth density. The fourth sub-pixel P4 has a same color as the first sub-pixel P1, the fifth sub-pixel P5 has a same color as the second sub-pixel P2, and the sixth sub-pixel P6 has a same color as the third sub-pixel P3. Each of the first density, the second density, the third density and the fourth density described herein indicates the number of sub-pixels per unit area. The conventional display region is configured to display image to achieve a full-color display using the first sub-pixels, the second sub-pixels and the third sub-pixels. A light sensor configured to transmit light and display is arranged under the translucent display region of the display area. In the present disclosure, the first density of the first sub-pixels P1 is equal to the third density of the fourth sub-pixels P4, and the second density of the second sub-pixels or the third sub-pixels is greater than the fourth density of the fifth sub-pixels or the sixth sub-pixels. In the present disclosure, the fourth sub-pixels serve as brightness centers of the pixels, and a density of the brightness centers in the translucent display region is the same as that of the conventional display region, which can ensure the display effects of the translucent display region and the conventional display region are close or even consistent. In the meantime, the density of the fifth sub-pixels and the density of the sixth sub-pixels are reduced to be smaller than the second density of the second sub-pixels or the third sub-pixels, thereby reducing the number of sub-pixels in the translucent display region and further reducing the number of pixel driving circuits configured to drive the sub-pixels. Therefore, the area occupied by the opaque elements in the translucent display region can be greatly reduced, and thus light transmittance in the translucent display region can be increased, allowing the camera to be disposed under the screen and reaching a higher screen-to-body ratio.

Referring to FIG. 2, the display panel can further include a pixel driving circuit configured to drive the sub-pixel to emit light, and the pixel driving circuit includes transistors and a storage capacitor. The transistor includes an active layer. Taking low temperature poly-silicon (LTPS) as an example, the low temperature poly-silicon is located in poly; a gate of the transistor and one plate of the storage capacitor are located in a first metal layer M1; some signal transmission lines and the other plate of the storage capacitor are located in Mc, and a power signal line and data lines are located in M2; the sub-pixel includes a light-emitting element, which includes an anode 500, a cathode 700, and an organic light-emitting material 600 located between the cathode and the anode. The anode 500 is connected to a drain M2 of the transistor through a via-hole located in a planarization layer PLN. A light-emitting area of the sub-pixel is located in an opening area of the pixel definition layer PDL. An opening of each sub-pixel in the present disclosure is not limited to a shape of square as shown in the drawing. In order to reduce the influence of diffraction on the light of the camera under the screen, the opening of the sub-pixels can also be round or oval. In an embodiment of the present disclosure, the anode of the sub-pixel anode 500 has a shape of a circle or an ellipse, which can reduce the diffraction.

Green sub-pixels have the greatest contribution to white light, as the human eyes are most sensitive to green light. The green sub-pixels have high brightness and thus are suitable for serving as a brightness center. In an embodiment of the present disclosure, the first sub-pixels P1 and the fourth sub-pixels P4 are green sub-pixels.

Figure 4:
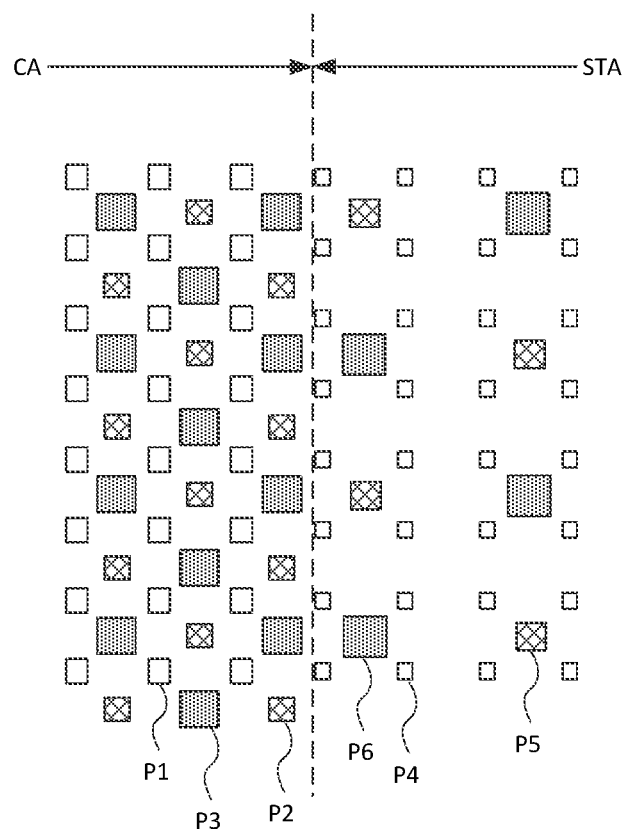
FIG. 4 is a partially enlarged schematic view of a region A shown in FIG. 1 according to an embodiment.

FIG. 4 is a partially enlarged schematic view of a region A of FIG. 1 according to another embodiment. Referring to FIG. 4, the third density of the fourth sub-pixels P4 is equal to the first density of the first sub-pixels P1, which can make the density of sub-pixels in the translucent display region be visually close to or even equal to the density of sub-pixels in the conventional display region. In order to improve the transmittance of the translucent display region, in an embodiment, an opening area of the fourth sub-pixels P4 in the translucent display region is smaller than an opening area of the first sub-pixels P1 in the conventional display region, thereby improving a camera effect of the camera under the screen. On the other hand, in the conventional display region CA, a ratio (the number of the first sub-pixels: the number of the second sub-pixels:the number of the third sub-pixels) can be used to algorithmically set a brightness ratio of the sub-pixels, so as to display a variety of colors. The density of the fifth sub-pixels P5 and the density of the sixth sub-pixels P6 in the translucent display region is smaller than the density of the second sub-pixels and the density of the third sub-pixels in the conventional display region, while the density of the fourth sub-pixels P4 in the translucent display region is equal to the density of the first sub-pixels in the conventional display region. In this way, a ratio of the number of the fourth sub-pixels to the number of the fifth sub-pixels is greater than a ratio of the number of the first sub-pixels to the number of the second sub-pixels located in the conventional display region, and a ratio of the number of the fourth sub-pixels to the number of the sixth sub-pixels is greater than a ratio of the number of the first sub-pixels to the number of the third sub-pixels located in the conventional display region, resulting in that the brightness ratios of sub-pixels are reconfigured by an algorithm, or directly leading to a display distortion. In the present disclosure, an opening area of the fourth sub-pixel is smaller than an opening area of the first sub-pixel, which can reduce a brightness of the fourth sub-pixel per unit current. In this regard, despite of high ratio of the number of the fourth sub-pixels, the brightness ratio of the fourth sub-pixels is reduced, so as to better match the algorithm used in the conventional display region and to avoid display distortion. It should be noted that the opening area refers to an area corresponding to the opening of the pixel definition layer in the sub-pixel, i.e., an area of the light-emitting area of the sub-pixel.

In an embodiment, referring to FIG. 4, in order to compensate for the decreased ratio of the number of the fourth sub-pixels to the number of the fifth sub-pixels and the decreased ratio of the number of the fourth sub-pixels to the number of the sixth sub-pixels in the translucent display region, an area of the fifth sub-pixel is larger than an area of the second sub-pixel, and an area of the sixth sub-pixel is larger than an area of third sub-pixel. In this way, the opening area of the fifth sub-pixel and the opening area of the sixth sub-pixel can be increased, thereby increasing the brightness ratio of the fifth sub-pixel and the brightness ratio of the sixth sub-pixel. Although the ratio of the number of the fourth sub-pixels to the number of the fifth sub-pixels and the ratio of the number of the fourth sub-pixels to the number of the sixth sub-pixels are relatively small, the brightness ratio of the fifth sub-pixels and the brightness ratio of the sixth sub-pixels are increased, which can match the algorithm used in the conventional display region in a better way to avoid the display distortion. In addition, as the fourth density of the fifth sub-pixels and the sixth sub-pixels is smaller than the second density of the second sub-pixels and the third sub-pixels, when the brightness of sub-pixels is the same, the brightness per unit area in the display panel will be relatively low due to the smaller number. Thus, it is required to increase the brightness of each sub-pixel to ensure that the brightness of the translucent display region is consistent with the brightness of the conventional display region. However, in order to increase the brightness of sub-pixels, the current for driving the sub-pixels must be increased, which can accelerate the aging of the sub-pixels and in turn results in a faster aging of the sub-pixels in the translucent display region than those in the conventional display region, thereby producing a clear boundary. Therefore, in an embodiment, the opening area of the fifth sub-pixel is larger than the opening area of the second sub-pixel, which reduces the current of the fifth sub-pixel, such that the aging of the fifth sub-pixel occurs at a similar or the same speed as that of the second sub-pixels; and the opening area of the sixth sub-pixel is larger than the opening area of the third sub-pixel, which reduces the current of the sixth sub-pixel, such that the aging of the sixth sub-pixel occurs at a similar or the same speed as the third sub-pixels, respectively, thereby avoiding an appearance of an obvious boundary between the conventional display region and the translucent display region.

In an embodiment, from the perspective of material properties, due to material properties, the blue sub-pixels have the shortest service life, while the red sub-pixels have a longer service life; from the perspective of driving the light-emitting element, in order to obtain the same brightness, a driving current of the blue light-emitting element is twice that of the red sub-pixel; thus, the brightness of the blue sub-pixel decreases faster with time. When displaying white, the brightness of blue sub-pixel decreases more due to the faster decay of the service life thereof, while the brightness of the red sub-pixel decreases less. In this regard, a proportion of red light increases, a proportion of blue light decreases, and the white light displayed finally becomes reddish. In an embodiment, the second sub-pixels are red sub-pixels, the third sub-pixels are blue sub-pixels, the fifth sub-pixels are red sub-pixels, the sixth sub-pixels are blue sub-pixels, the opening area of the fifth sub-pixel is smaller than the opening area of the sixth sub-pixel, and the opening area of the second sub-pixel is smaller than the opening area of the third sub-pixel. In this embodiment, by setting the blue sub-pixels to have a larger area than the red sub-pixels, the current of the blue sub-pixels per unit area is reduced, so as to have a service life close to that of the red sub-pixels, thereby avoiding a color cast during a long time use.

Figure 5:
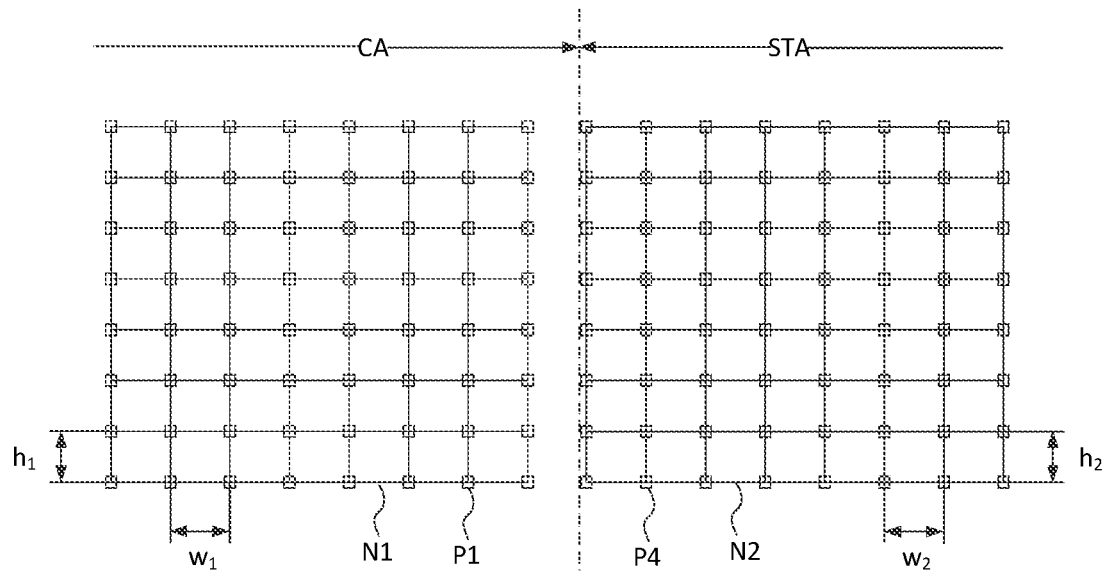
FIG. 5 is a schematic diagram of some pixels shown in FIG. 3.
Figure 6:
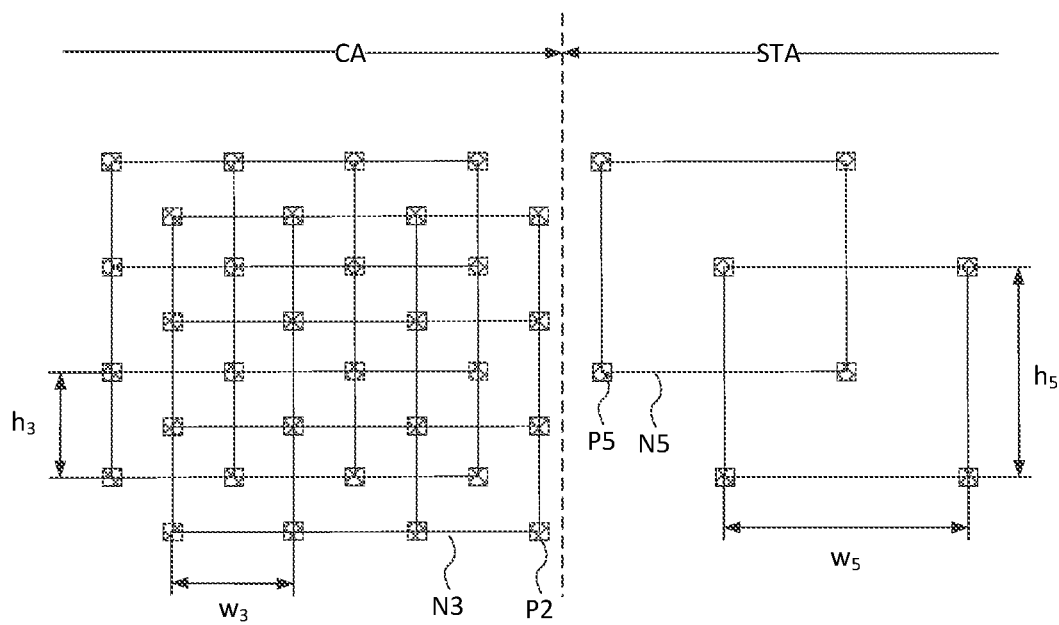
FIG. 6 is a schematic diagram of some other pixels shown in FIG. 3.
Figure 7:
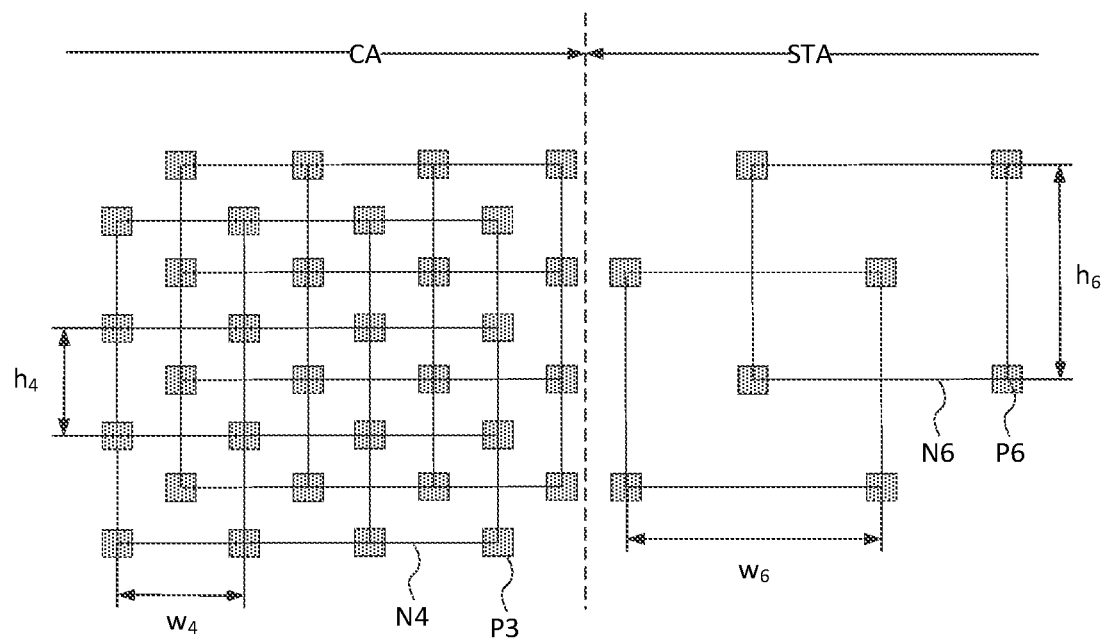
FIG. 7 is a schematic diagram of some other pixels shown in FIG. 3.

Another embodiment of the present disclosure is illustrated in FIG. 5 to FIG. 7. FIG. 5 is a schematic diagram of a part of pixels shown in FIG. 3; FIG. 6 is a schematic diagram of another part of pixels shown in FIG. 3; and FIG. 7 is a schematic diagram of yet another part of pixels shown in FIG. 3.

Referring to FIG. 5, when the display panel is configured to display a line or a plane with a width greater than a width of one sub-pixel, an actual width viewed by the human eyes is a width of sub-pixels together with spaces between these sub-pixels. For example, when displaying a straight line in a row direction with a width of two green sub-pixels, in addition to the width of the sub-pixels themselves, the spaces between the sub-pixels is also viewed as a part of the width of the line. Therefore, the actually viewed width is equal to a sum of the width of the first sub-pixel P1 and $h_1$. When the displayed width is wider, the spaces between the sub-pixels take the main part of the width. For example, when the width of the straight line in the row direction of the display is 10 green sub-pixels, the actually viewed width is equal to a sum of nine times the width of the first sub-pixels P1 and nine times $h_1$. Thus, the wider the width, the more significant part of the displayed width is taken by the spaces between the sub-pixels. In order to avoid an appearance of the difference between the viewed width in the translucent display region STA by the eyes and the viewed width in the conventional display region CA by the eyes, in an embodiment of the present disclosure, in the conventional display region CA, the centers of the first sub-pixels P1 form a plurality of first grids N1, and the first grid has a width $w_1$ along a pixel row direction and a length $h_1$ along a pixel column direction. In the translucent display region STA, centers of the fourth sub-pixels P4 form a plurality of second grids N2, the second grid has a width $w_2$ along the pixel row direction and a length $h_2$ along the pixel column direction, where $h_1=h_2$, and $w_1=w_2$. In this way, despite the variations of the opening area of the fourth sub-pixels, the space between adjacent fourth sub-pixels P4 in the pixel row direction and the space between adjacent fourth sub-pixels P4 in the pixel column direction are respectively equal to the space between the adjacent first sub-pixels P1 in the pixel row direction and the space between the adjacent first sub-pixels P1 in the pixel column direction, so that the displayed width of the image (a line or a plane) to be displayed in the translucent display region STA is substantially same as the displayed width of the image (a line or a plane) to be displayed in the conventional display region CA, thereby improving the display effect of the translucent display region.

In another embodiment of the present disclosure, as illustrated in FIG. 6 and FIG. 7, in order to increase the transmittance of the translucent display region STA, the density of red sub-pixels in the translucent display region STA and the density of blue sub-pixels in the translucent display region STA are reduced, and thus the space between the adjacent fifth sub-pixels/sixth sub-pixels cannot be the same as the space between the adjacent second sub-pixels/third sub-pixels. In order to maintain the displayed width of the image to be displayed in the translucent display region STA to be as close as the displayed width of the image to be displayed in the conventional display region CA, the display effect of the translucent display region is improved. In an embodiment, in the conventional display region CA, the centers of the second sub-pixels P2 form a plurality of third grids N3, each third grid N3 has a width $w_3$ along the pixel row direction and a length $h_3$ along the pixel column direction, and the centers of the third sub-pixels P3 form a plurality of fourth grids N4, each third grid N4 has a width $w_4$ along the pixel row direction and a length $h_4$ along the pixel column direction. Furthermore, in the translucent display region STA, the centers of the fifth sub-pixels P5 form a plurality of fifth grids N5, each fifth grid N5 has a width $w_5$ along the pixel row direction and a length $h_5$ along the pixel column direction, and the centers of the sixth sub-pixels P6 form a plurality of sixth grids N6, each sixth grid N6 has a width $w_6$ along the pixel row direction and a length $h_6$ along the pixel column direction, where $h_5=h_6=2*h_3=2*h_4$, and $w_5=w_6=2*w_3=2*w_4$. According to this embodiment, when the sub-pixels width information of the image to be displayed is even-numbered lines, the width information displayed by the translucent display region STA is exactly the same as that of the conventional display region C. When the sub-pixels width information of the image to be displayed is odd-numbered lines, the width information displayed by the translucent display region STA differs from that of the conventional display region CA by one space between the sub-pixels in the conventional display region. Therefore, the displayed width information of the translucent display region STA and the conventional display region CA are close or even identical, thereby improving the display effect of the translucent display region STA.

With reference to FIG. 3, the display panel includes first units U1 and second units U2 in the conventional display region CA. Each first unit U1 includes one first sub-pixel and one second sub-pixel located at the bottom right of the one first sub-pixel. Each second unit includes one first sub-pixel and one third sub-pixel located at the bottom right of the one first sub-pixel. The first units and the second units are arranged alternately in the pixel row direction, and also alternately in the pixel column direction. The centers of four first sub-pixels P1 adjacent to one second sub-pixels P2 form a virtual quadrilateral, and this second sub-pixel is located at the center of the virtual quadrilateral. The centers of four first sub-pixels P1 adjacent to one third sub-pixel P3 form a virtual quadrilateral, and this third sub-pixel is located at the center of the virtual quadrilateral. The brightness of the first unit U1 is enhanced by the third sub-pixel P3 in its adjacent second unit U2, thereby realizing full-color display. In the same way, the brightness of the second unit U2 is enhanced by the second sub-pixel P2 in its adjacent first unit U1 to realize the full-color display. In the present disclosure, the conventional display region CA uses a rendering algorithm for display, which reduces the number of pixels and ensure the fineness of the display at the same time. In the following example, the first sub-pixels and the fourth sub-pixels are green sub-pixels, the second sub-pixels and the fifth sub-pixels are red sub-pixels, and the third sub-pixels and the sixth sub-pixels are blue sub-pixels.

Figure 8:
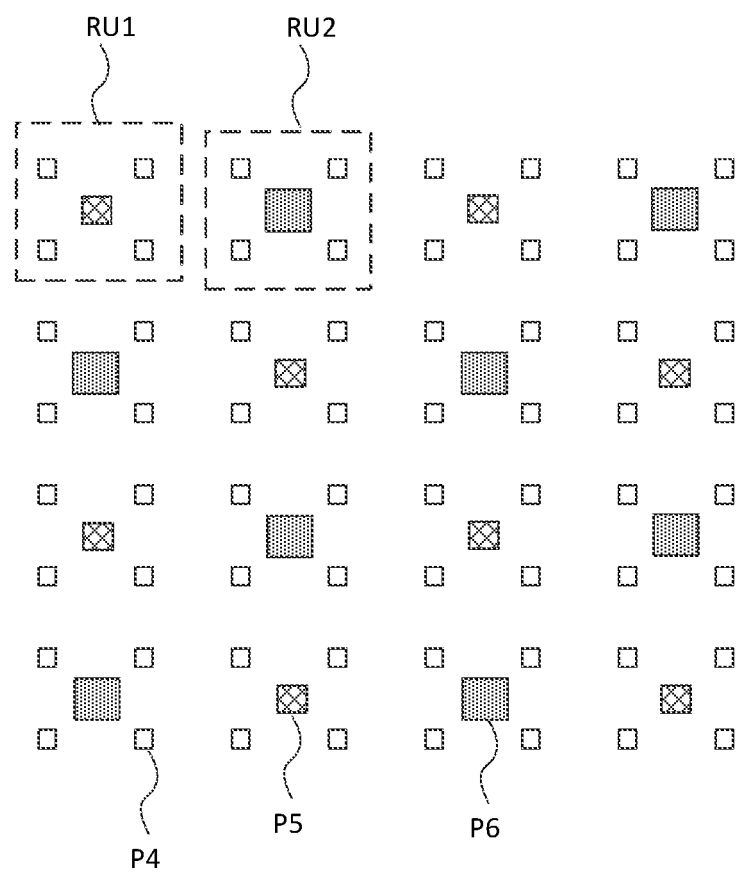
FIG. 8 is a schematic diagram of a pixel arrangement in a translucent display region according to an embodiment of the present disclosure.
Figure 9:
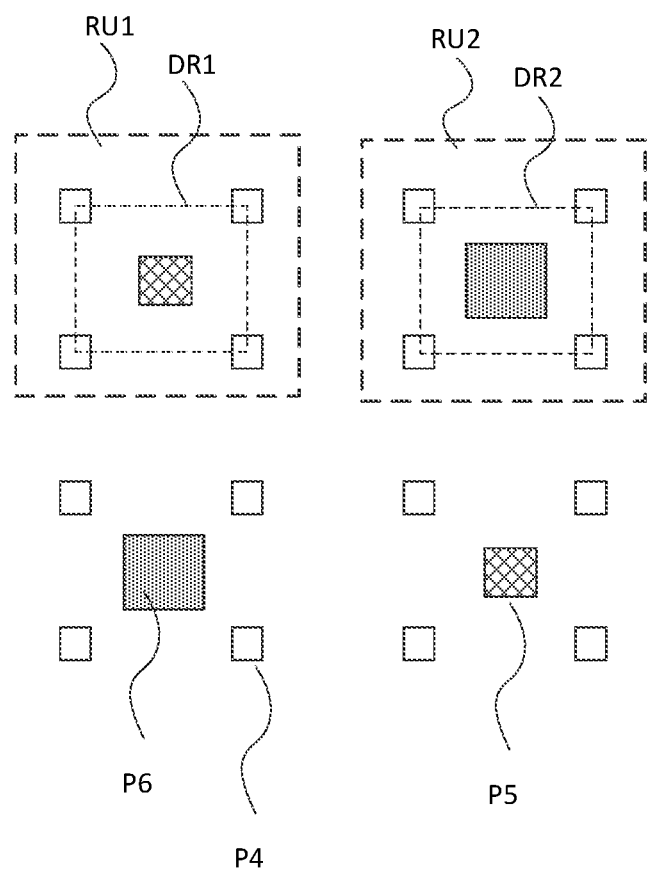
FIG. 9 is a schematic diagram of a pixel arrangement in a translucent display region according to another embodiment of the present disclosure.
Figure 10:
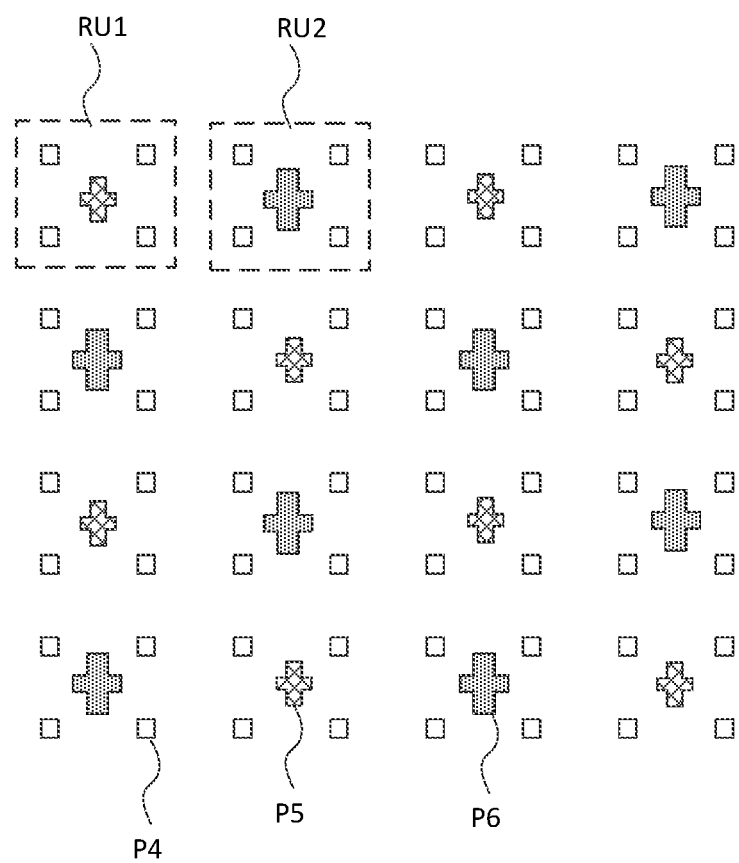
FIG. 10 is a schematic diagram of a pixel arrangement in a translucent display region according to yet another embodiment of the present disclosure.
Figure 11:
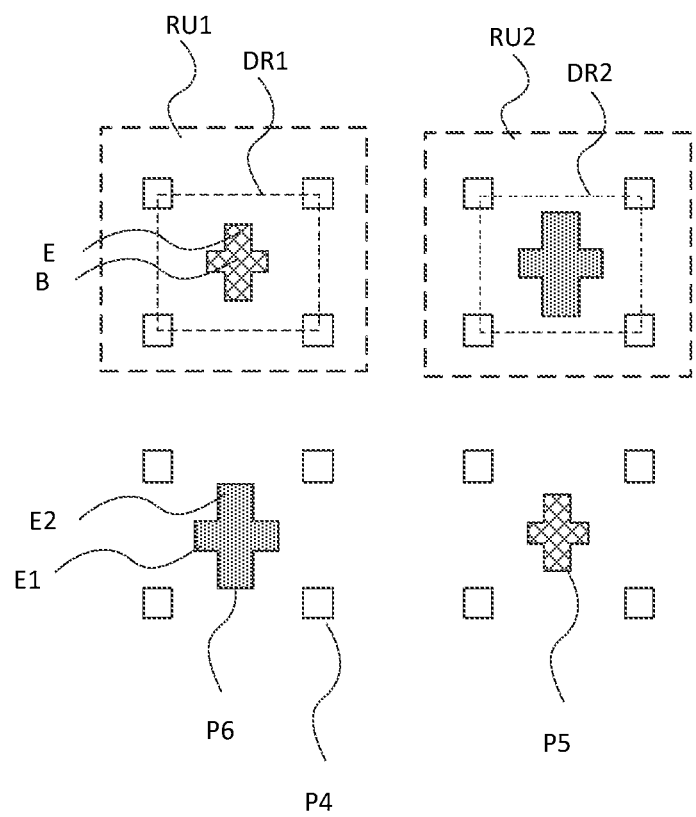
FIG. 11 is a schematic diagram of a pixel arrangement in a translucent display region according to yet another embodiment of the present disclosure.

Other embodiments of the present disclosure are illustrated in FIG. 8 to FIG. 11. FIG. 8 is a schematic diagram of a pixel arrangement in a translucent display region according to an embodiment of the present disclosure; FIG. 9 is a schematic diagram of a pixel arrangement in a translucent display region according to another embodiment of the present disclosure; FIG. 10 is a schematic diagram of a pixel arrangement in a translucent display region according to yet another embodiment of the present disclosure; and FIG. 11 is a schematic diagram of a pixel arrangement in a translucent display region according to yet another embodiment of the present disclosure.

In an embodiment, the display panel includes first repeating units RU1 and second repeating units RU2 in the translucent display region STA. Each first repeating unit RU1 includes four fourth sub-pixels P4 and one fifth sub-pixel P5, the centers of the four fourth sub-pixels P4 form a first virtual rectangle DR1, and the fifth sub-pixel P5 is located at the center of the first virtual rectangle DR1. Each second repeating unit RU2 includes four fourth sub-pixels P4 and one sixth sub-pixel P6, the centers of the four fourth sub-pixels P4 form a second virtual rectangle DR2, and the sixth sub-pixel P6 is located at the center of the second virtual rectangle DR2. The first repeating units RU1 and the second repeating units RU2 are alternately arranged along the pixel row direction, and/or, the first repeating units RU1 and the second repeating units RU2 are alternately arranged along the pixel column direction. In an embodiment, the fourth density is one-eighth of the third density, and the fourth density is one-fourth of the second density. The density of sub-pixels in the translucent display region STA is reduced, and the light transmittance of the translucent display region is improved. Compared with the conventional display region CA, the number and position of the green sub-pixels (the fourth sub-pixels) in the translucent display region do not changed, and the number of the red sub-pixels (fifth sub-pixels) and the number of the blue sub-pixels (sixth sub-pixels) are respectively reduced to ¼ of those in the conventional display region. However, in terms of position, the red sub-pixel and the blue sub-pixel are located in the centers of the virtual rectangles formed by adjacent green sub-pixels; and along the pixel row direction and the pixel column direction, the red sub-pixels and the green sub-pixels are still arranged alternately. Therefore, through the algorithm, each of the red sub-pixel and the blue sub-pixel is shared by eight green sub-pixels, and each green sub-pixel occupies about ⅛ of the brightness of red and blue sub-pixels to achieve the color ratio, thereby not reducing the density of sub-pixels in the translucent display region and improving the transmittance of the translucent display region. In an embodiment, the first virtual rectangle or the second virtual rectangle is a flat shape with four straight sides, two of which are longer than the other two, and four angles of 90°. In another embodiment, the first virtual rectangle or the second virtual rectangle is a square.

Further referring to FIG. 10 and FIG. 11, each of the fifth sub-pixel P5 and the sixth sub-pixel P6 includes a body portion B and extension portions E, the body portion B is located at the center of the virtual rectangle, and the extension portion E is formed by extending from the body portion B towards a space formed between two adjacent fourth sub-pixels P4. In this way, the opening area of each fifth sub-pixel and the opening area of each sixth sub-pixel are increased, thereby increasing the brightness thereof. In this way, although the ratio of the number of the fourth sub-pixel to the number of the fifth sub-pixels and the ratio of the number of the fourth sub-pixel to the number of the number of the sixth sub-pixels are relatively small, the brightness ratio of the fifth sub-pixels and the brightness ratio of the sixth sub-pixels can be increased, thereby better matching the algorithm of the conventional display region and avoiding the display distortion. In another aspect, as the fourth density of the fifth sub-pixels and the sixth sub-pixels is smaller than the second density of the second sub-pixels and the third sub-pixels, when the brightness of all sub-pixel is the same, the brightness per unit area of the display panel will be relatively low due to the smaller number. Thus, the brightness of all sub-pixels is increased to ensure that the brightness of the translucent display region is consistent with the brightness of the conventional display region. However, in order to increase the brightness of sub-pixels, the current for driving the sub-pixels must be increased, which can accelerate the aging of the sub-pixels and in turn results in a faster aging of the sub-pixels in the translucent display region than those in the conventional display region, thereby producing a clear boundary. Therefore, in the present embodiment, the opening area of the fifth sub-pixel and the opening area of the sixth sub-pixel are set to be larger than the opening area of the second sub-pixel and the opening area of the third sub-pixel, the current of the fifth sub-pixel and the sixth sub-pixel is reduced, such that the aging thereof occurs in a similar or the same speed as the second sub-pixel and the third sub-pixel, thereby avoiding the obvious boundary between the conventional display region and the translucent display region. In another aspect, in an embodiment, a visual center of the fifth sub-pixel and a visual center of the sixth sub-pixel are respectively dispersed to their adjacent fourth sub-pixels P4, which compensates the lack of sub-pixels in the surrounding region, when compared with the conventional display region, thereby improving the display effect to a certain extent.

The human eyes have a wider field of view in the left and right direction (pixel row direction), and a slightly narrower field of view in the vertical direction (pixel column direction), and the human eyes can more easily distinguish discontinuities in the column direction. In this regard, in an embodiment, the extension portions include first extension portions E1 extending along the pixel row direction and second extension portions E2 extending along the pixel column direction. A length of the second extension portion E2 is greater than a length of the first extension portion E1, and a width of the second extension portion E2 is greater than a width of the first extension E1. The visual center can be shifted to the column direction to avoid the lack of pixels be observed, thereby avoiding the degradation of image quality visible to the eyes.

Figure 12:
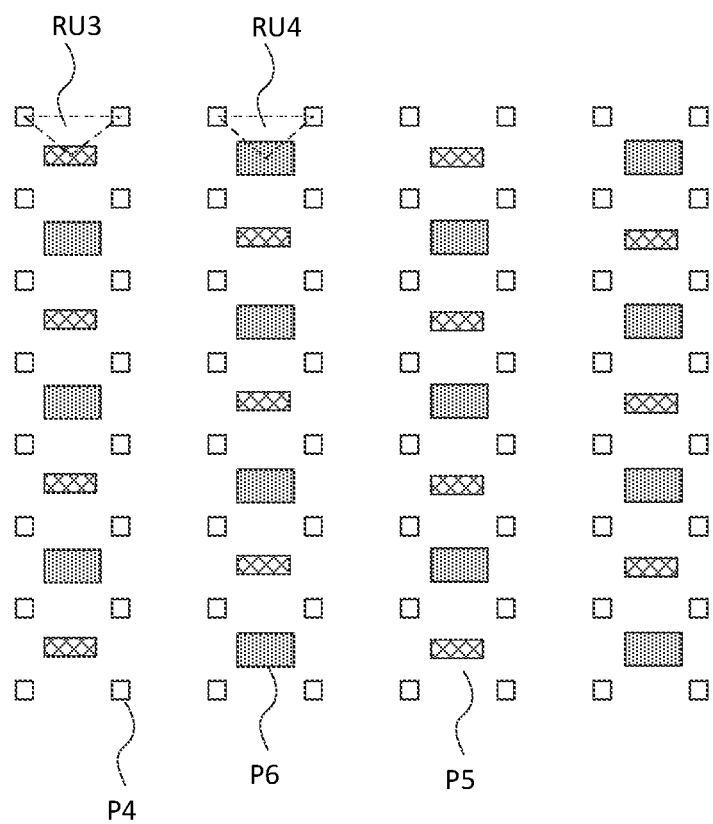
FIG. 12 is a schematic diagram of a pixel arrangement in a translucent display region according to yet another embodiment of the present disclosure.
Figure 13:
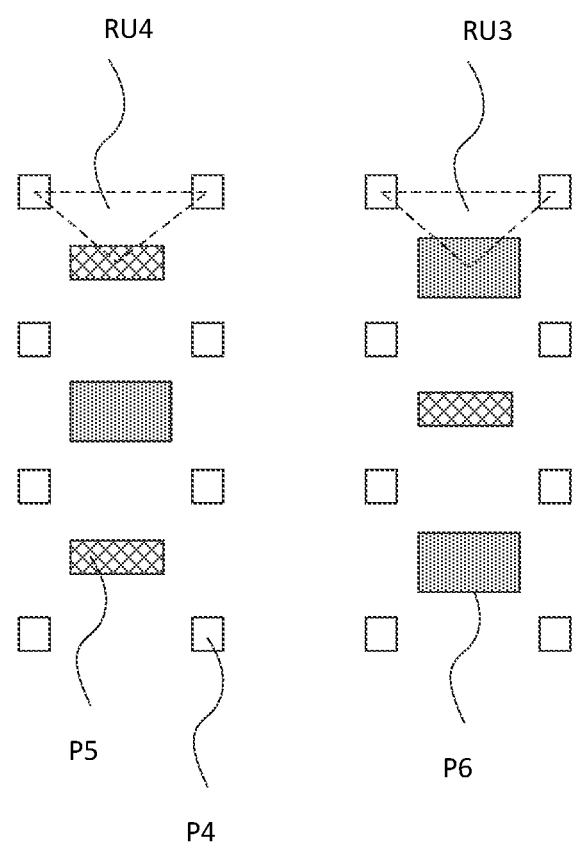
FIG. 13 is a schematic diagram of a pixel arrangement in a translucent display region according to yet another embodiment of the present disclosure.
Figure 14:
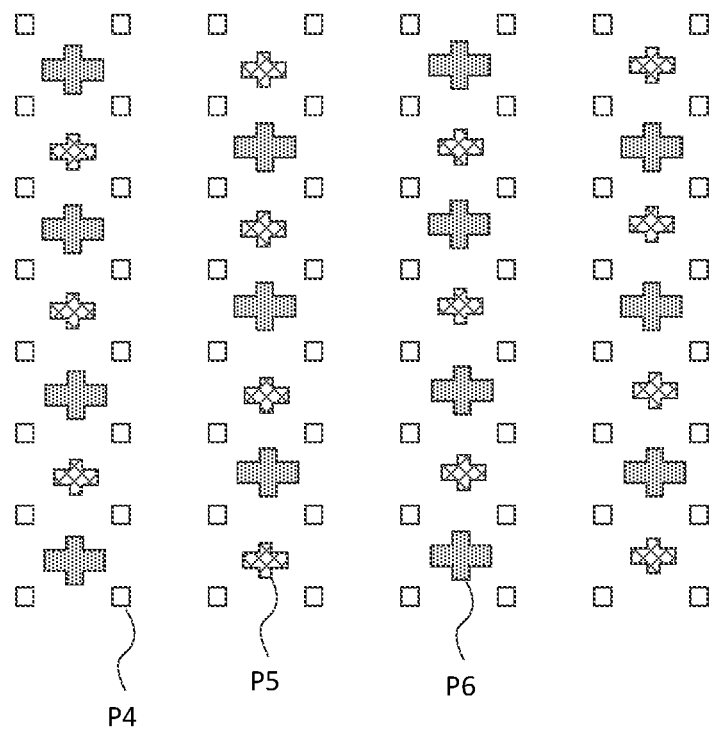
FIG. 14 is a schematic diagram of a pixel arrangement in a translucent display region according to yet another embodiment of the present disclosure.
Figure 15:
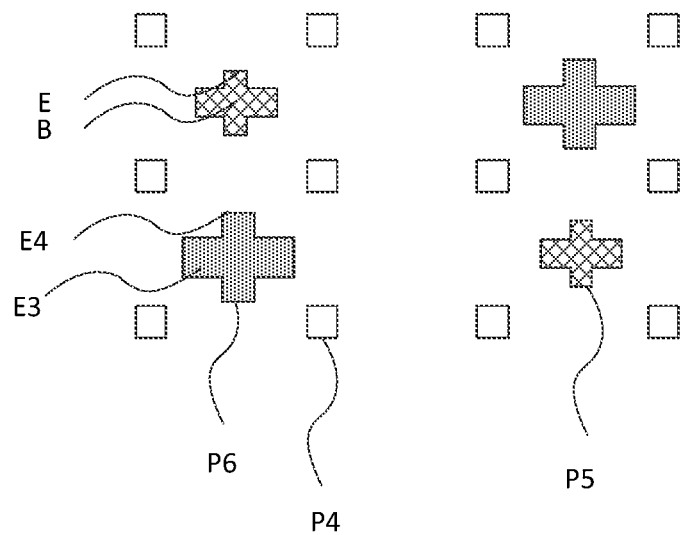
FIG. 15 is a schematic diagram of a pixel arrangement in a translucent display region according to yet another embodiment of the present disclosure.

Other embodiments of the present disclosure are illustrated in FIG. 12 to FIG. 15. FIG. 12 is a schematic diagram of a pixel arrangement in a translucent display region according to yet another embodiment of the present disclosure; FIG. 13 is a schematic diagram of a pixel arrangement in a translucent display region according to yet another embodiment of the present disclosure; FIG. 14 is a schematic diagram of a pixel arrangement in a translucent display region according to yet another embodiment of the present disclosure; and FIG. 15 is a schematic diagram of a pixel arrangement in a translucent display region according to yet another embodiment of the present disclosure.

The translucent display region STA includes third repeating units RU3 and fourth repeating units RU4. The third repeating unit RU3 includes two fourth sub-pixels P4 and one fifth sub-pixel P5, the centers of the two fourth sub-pixels P4 and the one fifth sub-pixel P5 form an isosceles triangle whose bottom edge is a connection line between the centers of the two fourth sub-pixels P4. The fourth repeating unit RU4 includes two fourth sub-pixels P4 and one sixth sub-pixel P6, the centers of the two fourth sub-pixels P4 and the one sixth sub-pixel P6 form an isosceles triangle whose bottom edge is a connection line between the centers of the two fourth sub-pixels P4. The third repeating units RU3 and the fourth repeating units RU4 are alternately arranged along the pixel row direction and/or the pixel column direction. In an embodiment, the fourth density is one-fourth of the third density, and the fourth density is one-half of the second density. In this way, the density of sub-pixels in the translucent display region STA is reduced, and the light transmittance of the translucent display region is improved. Compared with the conventional display region CA, the number and position of the green sub-pixels (fourth sub-pixels) in the translucent display region are not change, and the number of the red sub-pixels (fifth sub-pixels) and the blue sub-pixels (sixth sub-pixels) is reduced to ½ of that in the conventional display region. However, in terms of position, each of the red sub-pixel and the blue sub-pixel forms the isosceles triangle with the adjacent green sub-pixels; along the row direction and the column direction, the red sub-pixels and the green sub-pixels are still arranged alternately; and along the pixel row direction and the pixel column direction, the sub-pixels in the translucent display region are arranged in a same manner as the sub-pixels located in the conventional display region. Therefore, through the algorithm, each of the red sub-pixels and the blue sub-pixels is shared by four green sub-pixels, and each green sub-pixel occupies about ¼ of the brightness of red and blue sub-pixels to achieve the color ratio, thereby not reducing the density of sub-pixels in the translucent display region and improving the transmittance of the translucent display region.

In an embodiment, each of the fifth sub-pixels P5 and the sixth sub-pixels P6 includes a body portion B and extension portions E, the body portion B is located at a center of a virtual rectangle formed by four adjacent fourth sub-pixels, and the extension portion E is formed by extending from the body portion B towards a center of each edge of the virtual rectangle of the fourth sub-pixels P4. In an embodiment, the virtual rectangle is a flat shape with four straight sides, two of which are longer than the other two, and four angles of 90°. In another embodiment, the virtual rectangle is a square.

In this way, the opening area of each fifth sub-pixel and the opening area of each sixth sub-pixel are increased, thereby increasing the brightness thereof. In this way, although the ratio of the number of the fourth sub-pixel to the number of the fifth sub-pixels and the ratio of the number of the fourth sub-pixel to the number of the sixth sub-pixels are relatively small, the brightness thereof can be increased, thereby better matching the algorithm of the conventional display region and avoiding the display distortion. In one aspect, as the fourth density of the fifth sub-pixels and the sixth sub-pixels is smaller than the second density of the second sub-pixels and the third sub-pixels, when the brightness of each sub-pixel is the same, the brightness per unit area in the display panel will be relatively low due to the smaller number of sub-pixels. Thus, it is required to increase the brightness of each sub-pixel to ensure that the brightness of the translucent display region is consistent with the brightness of the conventional display region. However, in order to increase the brightness of sub-pixels, the current for driving the sub-pixels must be increased, which can accelerate the aging of the sub-pixels and in turn result in a faster aging of the sub-pixels in the translucent display region than those in the conventional display region, thereby producing a clear (observable) boundary. Therefore, in the present embodiment, the opening area of the fifth sub-pixels and the sixth sub-pixels is set to be larger than the opening area of the second sub-pixels and the third sub-pixels, and the current of the fifth sub-pixels and the sixth sub-pixels is reduced, such that the aging thereof occurs in a similar or the same speed as the second sub-pixels and the third sub-pixels, thereby avoiding the obvious boundary between the conventional display region and the translucent display region. In another aspect, in the present embodiment, a visual center of gravity of each fifth sub-pixel and each sixth sub-pixel is dispersed to the adjacent fourth sub-pixels P4, thus compensating the lack of sub-pixels in the surrounding region, when compared with the conventional display region, thereby improving the display effect to a certain extent.

Further, the extension portions include third extension portions E3 extending along the pixel row direction and fourth extension portions E4 extending along the pixel column direction; a length of the fourth extension portion E4 is smaller than a length of the third extension portion E3, and a width of the fourth extension portion E4 is smaller than a width of the third extension E3. In the translucent display region, for any one fifth sub-pixel, a distance to the adjacent sixth sub-pixel in the column direction are relatively small, and a distance to the adjacent sixth sub-pixel in the row direction are relatively large. Therefore, in this embodiment, the length and width of the fourth extension portion are set to be greater than those of the third extension portion, such that the visual center of gravity is shifted to a relatively vacant region, and the brightness distribution is more balanced, thereby improving sense of unity perceived by human eyes and avoiding visual gaps.

Figure 16:
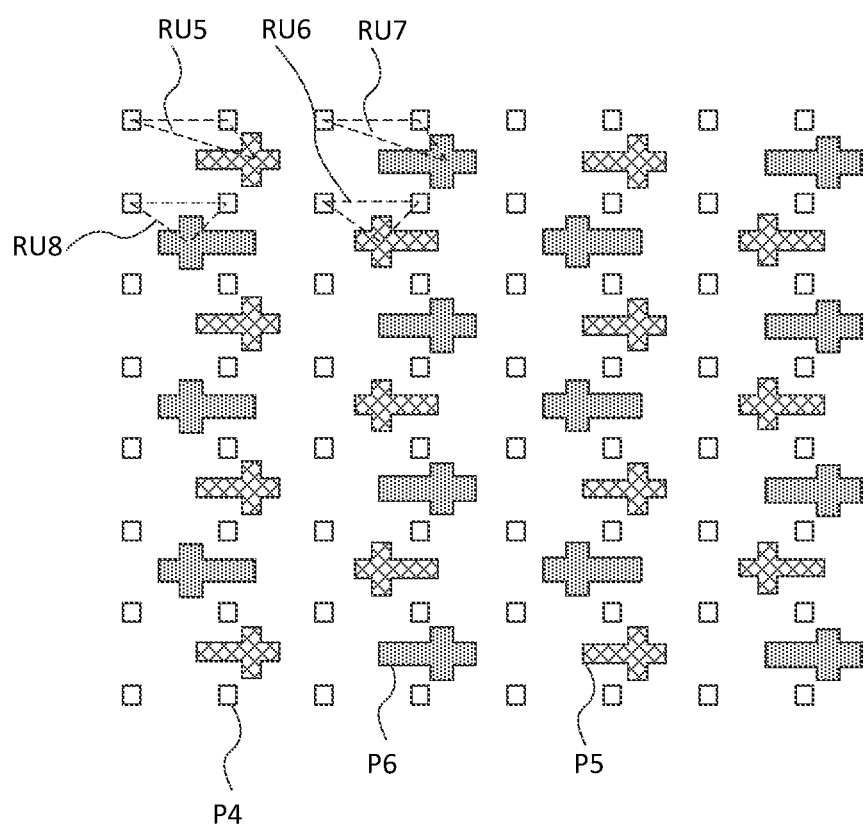
FIG. 16 is a schematic diagram of a pixel arrangement in a translucent display region according to yet another embodiment of the present disclosure.
Figure 17:
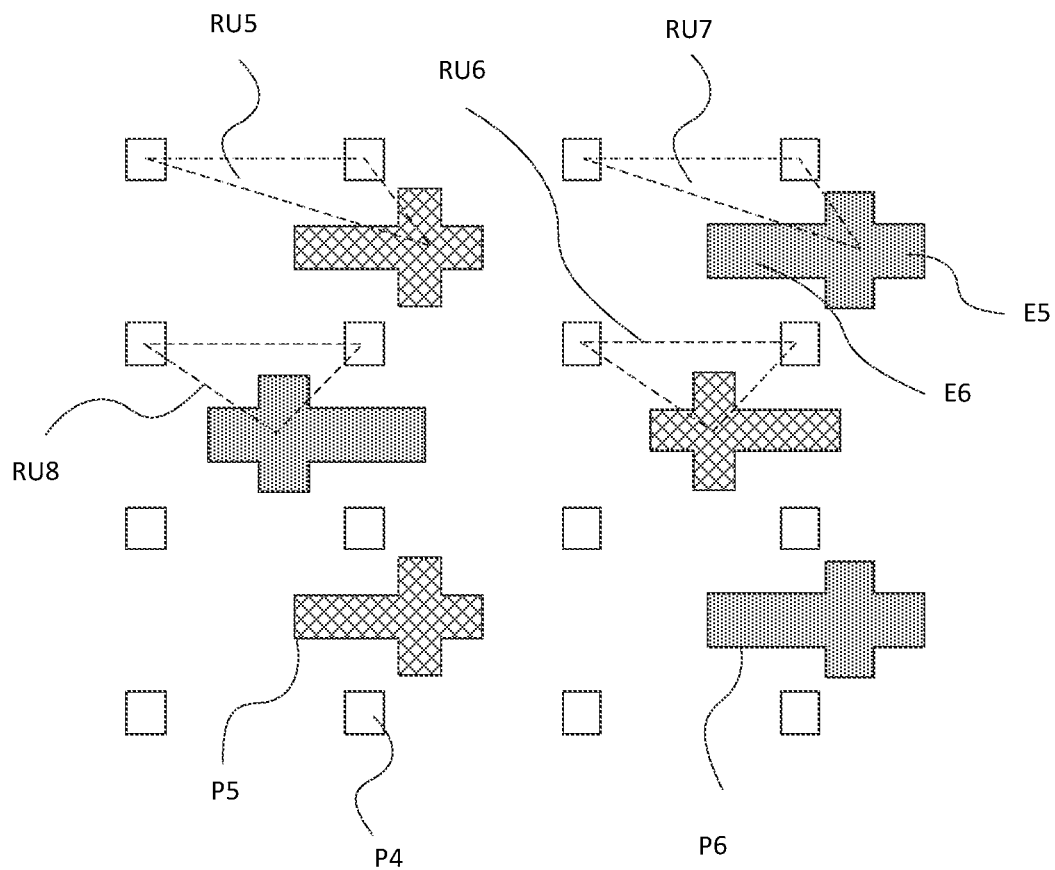
FIG. 17 is a schematic diagram of a pixel arrangement in a translucent display region according to yet another embodiment of the present disclosure.

Other embodiments of the present disclosure are illustrated in FIG. 16 and FIG. 17. FIG. 16 is a schematic diagram of a pixel arrangement in a translucent display region according to yet another embodiment of the present disclosure, and FIG. 17 is a schematic diagram of a pixel arrangement in a translucent display region according to yet another embodiment of the present disclosure.

The translucent display region STA includes fifth repeating units RU5, sixth repeating units RU6, seventh repeating units RU7, and eighth repeating units RU8. The fifth repeating unit RU5 includes two fourth sub-pixels P4 and one fifth sub-pixel P5, and the centers of the two fourth sub-pixels P4 and the center of the one fifth sub-pixel P5 form an obtuse triangle. The obtuse triangle has a bottom edge that is a connection line between the centers of the two fourth sub-pixels P4, and a side connecting the center of the one fifth sub-pixel P5 of the fifth repeating unit RU5 and the center of one of the two fourth sub-pixels P4 of the fifth repeating unit RU5. The bottom edge and the side of the obtuse triangle form an obtuse angle. The sixth repeating unit RU6 includes two fourth sub-pixels P4 and one fifth sub-pixel P5, and the centers of the two fourth sub-pixels P4 and the center of the one fifth sub-pixel P5 form a triangle. The triangle has a bottom edge that is a connection line between the centers of the two fourth sub-pixels P4 of the sixth repeating unit RU6, a first side connecting the center of the one fifth sub-pixel P5 of the sixth repeating unit RU6 and the center of one of the two fourth sub-pixels P4 of the sixth repeating unit RU6, and a second side connecting the center of the one fifth sub-pixel P5 of the sixth repeating unit RU6 and the center of the other one of the two fourth sub-pixels P4 of the sixth repeating unit RU6; and the bottom edge and the first side of the triangle form an acute angle, and the bottom edge and the second side of the triangle form an acute angle.

Each seventh repeating unit RU7 includes two fourth sub-pixels P4 and one sixth sub-pixel P6, the centers of the two fourth sub-pixels P4 and the one sixth sub-pixel P6 form an obtuse triangle. The obtuse triangle has a bottom edge that is a connection line between the centers of the two fourth sub-pixels P4 of the seventh repeating unit RU7, and a side connecting the center of the one sixth sub-pixel P6 of the seventh repeating unit RU7 and the center of one of the two fourth sub-pixels P4 of the seventh repeating unit RU7. The bottom edge and the side of the obtuse triangle form an obtuse angle. Each eighth repeating unit RU8 includes two fourth sub-pixels P4 and one sixth sub-pixel P6, and the centers of the two fourth sub-pixels P4 and the one sixth sub-pixel P6 form a triangle. The triangle has a bottom edge that is a connection line between the centers of the two fourth sub-pixels P4 of the eighth repeating unit RU8, a first side connecting the center of the one sixth sub-pixel P6 of the eighth repeating unit RU8 and the center of one of the two fourth sub-pixels P4 of the eighth repeating unit RU8, and a second side connecting the center of the one sixth sub-pixel P6 of the eighth repeating unit RU8 and the center of the other one of the two fourth sub-pixels P4 of the eighth repeating unit RU8. The bottom edge and the first side of the triangle form an acute angle, and the bottom edge and the second side of the triangle form an acute angle. Along the pixel row direction, the fifth repeating units RU5 and the seventh repeating units RU7 are alternately arranged, or the sixth repeating units RU6 and the eighth repeating units RU8 are alternately arranged; and along the pixel column direction, the fifth repeating units RU5 and the eighth repeating units RU8 are alternately arranged, or the sixth repeating units RU6 and the seventh repeating units RU7 are alternately arranged. For example, in an odd-numbered row, the fifth repeating unit RU5 and the seventh repeating unit RU7 are alternately arranged, and in an even-numbered row, the sixth repeating unit RU6 and the eighth repeating unit RU8 are alternately arranged; in an odd-numbered column, the fifth repeating unit RU5 and the eighth repeating unit RU8 are alternately arranged, or in an even-numbered column, the sixth repeating unit RU6 and the seventh repeating unit RU7 are alternately arranged. In the present embodiment, the density of sub-pixels in the translucent display region STA is reduced, and the light transmittance of the translucent display region is improved. Compared with the conventional display region CA, the number and position of the green sub-pixels (fourth sub-pixels) in the translucent display region do not changed, and the number of the red sub-pixels (fifth sub-pixels) and the number of the blue sub-pixels (sixth sub-pixels) are respectively reduced to ½ of those in the conventional display region. However, in terms of position, each of the red sub-pixel and the blue sub-pixel forms the triangle with corresponding adjacent green sub-pixels; along the row direction and the column direction, the red sub-pixels and the green sub-pixels are still arranged alternately; and along the column direction, the sub-pixels in the translucent display region are arranged in a same manner as the sub-pixels located in the conventional display region. Therefore, through the algorithm, each of the red sub-pixel and blue sub-pixel is shared by four green sub-pixels, and each green sub-pixel occupies about ¼ of the brightness of red and blue sub-pixels to achieve the color ratio, thereby not reducing the density of sub-pixels in the translucent display region and improving the transmittance of the translucent display region. In addition, in this embodiment, no matter in the row direction or the column direction, in adjacent repeating units, a center of gravity of one of the fifth sub-pixel and the sixth sub-pixel is located inside the triangle and a center of gravity of the other one of the fifth sub-pixel and the sixth sub-pixel is located outside the triangle. Therefore, the visual center of gravity is dispersed, and the brightness is more evenly distributed in the panel, which is conducive to the improvement of the display effect.

Further, in order to obtain sufficient deviation of the visual center of gravity, the extension portions include a fifth extension E5 and a sixth extension E6 that extend along the pixel row direction; the fifth extension E5 is smaller than the half of the sixth extension E6, so as to produce a sufficient deviation of the visual center of gravity. In this way, the arrangement of the brightness center in the display area is relatively uniform, and it is avoided that the non-display gap is visible to the naked eyes.

Figure 18:
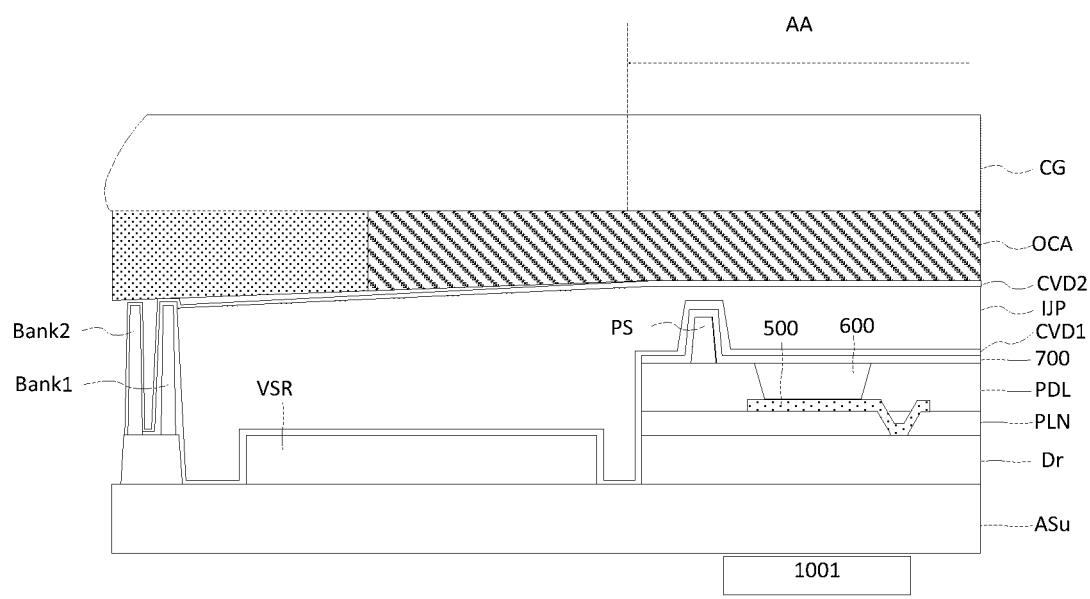
FIG. 18 a cross-sectional view of a display device according to an embodiment of the present disclosure.

FIG. 18 a cross-sectional view of a display device according to an embodiment of the present disclosure. With reference to FIG. 18, in an embodiment, the display panel includes an array substrate ASu and a driving layer disposed on the array substrate. The driving layer includes thin film transistors for forming the circuits configured to drive the light-emitting pixels. The driving layer in the display area includes a pixel circuit Dr, and the driving layer in the non-display area includes a gate driving circuit VSR. The pixel circuit Dr and the light-emitting pixel are separated by a planarization layer PLN, and the electrode of the light-emitting pixel and the pixel circuit Dr are electrically connected through a via-hole located in the planarization layer PLN. Taking the top emission pixel structure as an example, an anode 500 is electrically connected to the pixel circuit Dr through a via-hole. The light-emitting pixel further includes an organic light-emitting material 600 disposed in the opening of the pixel definition layer PDL, and a cathode 700 located on the organic light-emitting material 600. The pixel definition layer PDL is provided with a spacer PS for supporting a mask during evaporation. The flexible encapsulating layer covers the array substrate ASu. The flexible encapsulating layer includes a first inorganic layer CVD1, an organic layer IJP and a second inorganic layer CVD2, as well as a first barrier layer Bank1 and a second barrier layer Bank2 that are located in the periphery and block the organic layer. The display panel further includes a protective glass CG that is adhered to the display panel through an optical glue OCA. The display device of the present disclosure is provided with a light sensor 1001 under the translucent display region, and the light sensor can be an element such as a camera. In order to improve the transmittance of the translucent display region, in an embodiment of the present disclosure, a transition region can be provided between the conventional display region and the translucent display region; or the pixel circuit configured to drive the sub-pixels in the translucent display region to display can be provided in the transition region, which can improve the transmittance of the translucent display region. In an embodiment, after the driving circuit is provided in the transition region, the driving circuit is connected to a corresponding sub-pixel through a wire. The wire can be of "S" shape, which can reduce the diffraction of the translucent display region.

Figure 19:
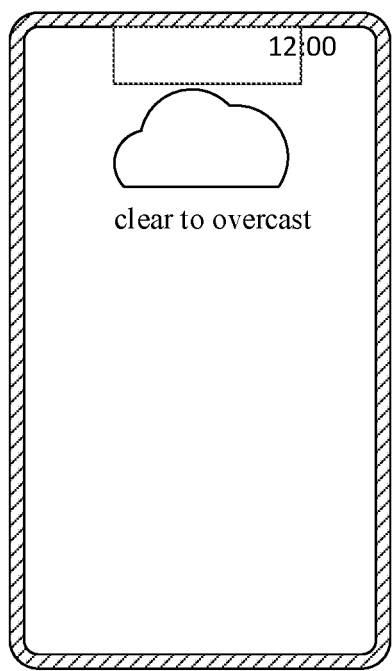
FIG. 19 is a schematic diagram of a display device according to an embodiment of the present disclosure.

In the present disclosure, the specific structure of the display panel 100 is described in detail in the above embodiments, and will not be repeated herein. The display device shown in FIG. 19 is only illustrative, and the display device can be any electronic device having a display function, such as a mobile phone 1000, a tablet computer, a notebook computer, an electronic paper book, or a television.

The above are merely some embodiments of the present disclosure, and are not intended to limit the present disclosure. Any modifications, equivalent substitutions or improvements made within the spirit and principles of the present disclosure shall be included in the protection scope of the present disclosure.

It should be noted that the above embodiments are only used to illustrate, but not to limit the technical solutions of the present disclosure. Although the present application is described in detail with reference to the foregoing embodiments, those skilled in the art shall understand that they can modify the technical solutions described in the foregoing embodiments, or equivalently replace some or all of the technical features. The modifications or replacements shall not direct the essence of the corresponding technical solutions away from the scope of the technical solutions of the embodiments of the present disclosure.

What is claimed is:

1. A display panel, the display panel having a display area and a non-display area surrounding the display area, and the display area comprising a conventional display area and a translucent display area;

the display panel comprising:

a plurality of first sub-pixels, a plurality of second sub-pixels, a plurality of third sub-pixels, a plurality of fourth sub-pixels, a plurality of fifth sub-pixels and a plurality of sixth sub-pixels, wherein the plurality of first sub-pixels, the plurality of second sub-pixels and the plurality of third sub-pixels are provided in a whole of the conventional display region respectively in a first density, a second density, and the second density, the plurality of fourth sub-pixels, the plurality of fifth sub-pixels and the plurality of sixth sub-pixels are provided in a whole of the translucent display region respectively in a third density, a fourth density, and the fourth density, each of the plurality of fourth sub-pixels has a same color as each of the plurality of first sub-pixels, each of the plurality of fifth sub-pixels has a same color as each of the plurality of second sub-pixels, and each of the plurality of sixth sub-pixels has a same color as each of the plurality of third sub-pixels, and the first density is equal to the third density, and the second density is greater than the fourth density.

2. The display panel according to claim 1, wherein each of the plurality of first sub-pixels and the plurality of fourth sub-pixels is a green sub-pixel.

3. The display panel according to claim 2, wherein an opening area of each of the plurality of fourth sub-pixels is smaller than an opening area of each of the plurality of first sub-pixels.

4. The display panel according to claim 2, wherein each of the plurality of fifth sub-pixels is a red sub-pixel, each of the plurality of sixth sub-pixels is a blue sub-pixel, and an opening area of each of the plurality of fifth sub-pixels is smaller than an opening area of each of the plurality of sixth sub-pixels.

5. The display panel according to claim 4, wherein each of the plurality of second sub-pixels is a red sub-pixel, each of the plurality of third sub-pixels is a blue sub-pixel, the opening area of each of the plurality of fifth sub-pixels is greater than an opening area of each of the plurality of second sub-pixels, and the opening area of each of the plurality of sixth sub-pixels is greater than an opening area of each of the plurality of third sub-pixels.

6. The display panel according to claim 1, wherein in the conventional display region, centers of the plurality of first sub-pixels form a plurality of first grids, and each of the plurality of first grids has a width $w_1$ between two opposite sides of the first grid along a pixel row direction and a length $h_1$ between two opposite sides of the first grid along a pixel column direction;

wherein in the translucent display region, centers of the plurality of fourth sub-pixels form a plurality of second grids, and each of the plurality of second grids has a width $w_2$ between two opposite sides of the second grid along the pixel row direction and a length $h_2$ between two opposite sides of the second grid along the pixel column direction; and wherein $h_1 = h_2$, and $w_1 = w_2$.

7. The display panel according to claim 6, wherein in the conventional display region, centers of the plurality of second sub-pixels form a plurality of third grids and centers of the plurality of third sub-pixels form a plurality of fourth grids, each of the plurality of third grids has a width $w_3$ between two opposite sides of the third grid along the pixel row direction and a length $h_3$ between two opposite sides of the third grid along the pixel column direction, and each of the plurality of fourth grids has a width $w_4$ between two opposite sides of the fourth grid along the pixel row direction and a length $h_4$ between two opposite sides of the fourth grid along the pixel column direction;

wherein, in the translucent display region, centers of the plurality of fifth sub-pixels form a plurality of fifth grids and centers of the plurality of sixth sub-pixels form a plurality of sixth grids, each of the plurality of fifth grids has a width $w_5$ between two opposite sides of the fifth grid along the pixel row direction and a length $h_5$ between two opposite sides of the fifth grid along the pixel column direction, and each of the plurality of sixth grids has a width $w_6$ between two opposite sides of the sixth grid along the pixel row direction and a length $h_6$ between two opposite sides of the sixth grid along the pixel column direction; and wherein $h_5 = h_{6=2} * h_{3=2} * h_4$, and $w_5 = w_{6=2} * w_{3=2} * w_4$.

8. The display panel according to claim 1, wherein a plurality of first repeating units and a plurality of second repeating units are provided in the translucent display region;

each of the plurality of first repeating units comprises four of the plurality of fourth sub-pixels and one of the plurality of fifth sub-pixels, wherein centers of the four fourth sub-pixels of the first repeating unit form a first virtual rectangle, and the one fifth sub-pixel is located at a center of the first virtual rectangle; and each of the plurality of second repeating units comprises four of the plurality of fourth sub-pixels and one of the plurality of sixth sub-pixels, wherein centers of the four fourth sub-pixels of the second repeating unit form a second virtual rectangle, and the one sixth sub-pixel is located at a center of the second virtual rectangle.

9. The display panel according to claim 8, wherein the plurality of first repeating units and the plurality of second repeating units are alternately arranged along a pixel row direction; or the plurality of first repeating units and the plurality of second repeating units are alternately arranged along a pixel column direction.

10. The display panel according to claim 9, wherein each of the plurality of fifth sub-pixels comprises a body portion located at the center of the first virtual rectangle and extension portions each formed by extending from the body portion towards a space formed between two adjacent fourth pixels of the plurality of fourth pixels; and wherein each of the plurality of sixth sub-pixels comprises a body portion located at the center of the second virtual rectangle and extension portions each formed by extending from the body portion towards a space formed between two adjacent fourth pixels of the plurality of fourth pixels.

11. The display panel according to claim 10, wherein the extension portions comprise first extension portions extending along the pixel row direction and second extension portions extending along the pixel column direction; and a length of each of the second extension portions is greater than a length of each of the first extension portions, and a width of each of the second extension portions is greater than a width of each of the first extensions.

12. The display panel according to claim 10, wherein the fourth density is one-eighth of the third density, and the fourth density is one-fourth of the second density.

13. The display panel according to claim 1, wherein a plurality of third repeating units and a plurality of fourth repeating units are provided in the translucent display region;

wherein each of the plurality of third repeating units comprises two of the plurality of fourth sub-pixels and one of the plurality of fifth sub-pixels, and centers of the two fourth sub-pixels of the third repeating unit and the one fifth sub-pixel form an isosceles triangle, of which a bottom edge is a connection line between the centers of the two fourth sub-pixels of the third repeating unit; and wherein each of the plurality of fourth repeating units comprises two of the plurality of fourth sub-pixels and one of the plurality of sixth sub-pixels, and centers of the two fourth sub-pixels of the fourth repeating unit and the one sixth sub-pixel form an isosceles triangle, of which a bottom edge is a connection line between the centers of the two fourth sub-pixels of the fourth repeating unit.

14. The display panel according to claim 13, wherein the plurality of third repeating units and the plurality of fourth repeating units are alternately arranged along at least one of a pixel row direction or a pixel column direction; and
wherein the fourth density is one-fourth of the third density, and the fourth density is one-half of the second density.

15. The display panel according to claim 14, wherein each of the plurality of fifth sub-pixels comprises a body portion and extension portions, the body potion is located at a center of a virtual rectangle formed by four adjacent fourth sub-pixels of the plurality of fourth sub-pixels, and the extension portions each is formed by extending from the body portion towards a space formed between two adjacent fourth sub-pixels of the plurality of fourth sub-pixels; and
wherein each of the plurality of sixth sub-pixels comprises a body portion and extension portions, the body portion is located at a center of a virtual rectangle formed by four adjacent fourth sub-pixels of the plurality of fourth sub-pixels, and the extension portions each are formed by extending from the body portion towards a space formed between two adjacent fourth sub-pixels of the plurality of fourth sub-pixels.

16. The display panel according to claim 15, wherein the extension portions comprise third extension portions extending along the pixel row direction and fourth extension portions extending along the pixel column direction;
wherein a length of each of the third extension portions is greater than a length of each of the fourth extension portions; and
wherein a width of each of the third extension portions is greater than a width of each of the fourth extensions.

17. The display panel according to claim 1, wherein a plurality of fifth repeating units, a plurality of sixth repeating units, a plurality of seventh repeating units, and a plurality of eighth repeating units are provided in the translucent display region;
wherein each of the plurality of fifth repeating units comprises two of the plurality of fourth sub-pixels and one of the plurality of fifth sub-pixels, centers of the two fourth sub-pixels and the one fifth sub-pixel of the fifth repeating unit form an obtuse triangle, wherein the obtuse triangle has a bottom edge that is a connection line between the centers of the two fourth sub-pixels of the fifth repeating unit, and a side connecting the center of the one fifth sub-pixel of the fifth repeating unit and the center of one of the two fourth sub-pixels of the fifth repeating unit, wherein the bottom edge and the side of the obtuse triangle form an obtuse angle;
wherein each of the plurality of sixth repeating units comprises two of the plurality of fourth sub-pixels and one of the plurality of fifth sub-pixels, centers of the two fourth sub-pixels and the one fifth sub-pixel of the sixth repeating unit form a triangle, wherein the triangle has a bottom edge that is a connection line between the centers of the two fourth sub-pixels of the sixth repeating unit, a first side connecting the center of the one fifth sub-pixel of the sixth repeating unit and the center of one of the two fourth sub-pixels of the sixth repeating unit, and a second side connecting the center of the one fifth sub-pixel of the sixth repeating unit and the center of the other one of the two fourth sub-pixels of the sixth repeating unit, wherein the bottom edge and the first side of the triangle form an acute angle, and the bottom edge and the second side of the triangle form an acute angle;
wherein each of the plurality of seventh repeating units comprises two of the plurality of fourth sub-pixels and one of the plurality of sixth sub-pixels, centers of the two fourth sub-pixels and the one sixth sub-pixel of the seventh repeating unit form an obtuse triangle, wherein the obtuse triangle has a bottom edge that is a connection line between the centers of the two fourth sub-pixels of the seventh repeating unit, and a side connecting the center of the one sixth sub-pixel of the seventh repeating unit and the center of one of the two fourth sub-pixels of the seventh repeating unit, wherein the bottom edge and the side of the obtuse triangle form an obtuse angle; and
wherein each of the plurality of eighth repeating units comprises two of the plurality of fourth sub-pixels and one of plurality of the sixth sub-pixels, centers of the two fourth sub-pixels and the one sixth sub-pixel of the eighth repeating unit form a triangle, wherein the triangle has a bottom edge that is a connection line between the centers of the two fourth sub-pixels of the eighth repeating unit, a first side connecting the center of the one sixth sub-pixel of the eighth repeating unit and the center of one of the two fourth sub-pixels of the eighth repeating unit, and a second side connecting the center of the one sixth sub-pixel of the eighth repeating unit and the center of the other one of the two fourth sub-pixels of the eighth repeating unit, wherein the bottom edge and the first side of the triangle form an acute angle, and the bottom edge and the second side of the triangle form an acute angle.

18. The display panel according to claim 17, wherein along a pixel row direction, the plurality of fifth repeating units and the plurality of seventh repeating units are alternately arranged, or the plurality of sixth repeating units and the plurality of eighth repeating units are alternately arranged; and
wherein, along the pixel column direction, the plurality of fifth repeating units and the plurality of eighth repeating units are alternately arranged, or the plurality of sixth repeating units and the plurality of seventh repeating units are alternately arranged.

19. The display panel according to claim 18, wherein each of the plurality of fifth sub-pixels comprises a body portion and extension portions, the body potion is located at a center of a virtual rectangle formed by four adjacent fourth sub-pixels of the plurality of fourth sub-pixels, and the extension portions each is formed by extending from the body portion towards a space formed between two adjacent fourth sub-pixels of the plurality of fourth sub-pixels;
wherein each of the plurality of sixth sub-pixels comprises a body portion and extension portions, the body portion is located at a center of a virtual rectangle formed by four adjacent fourth sub-pixels of the plurality of fourth sub-pixels, and the extension portions each are formed by extending from the body portion towards a space formed between two adjacent fourth sub-pixels of the plurality of fourth sub-pixels;
wherein the extension portions comprise a fifth extension and a sixth extension that extend along the pixel row direction; and
wherein the fifth extension is smaller than a half of the sixth extension.

20. A display device comprising a display panel, wherein the display panel has a display area and a non-display area surrounding the display area, and the display area comprises a conventional display area and a translucent display area;

the display panel comprises:

a plurality of first sub-pixels, a plurality of second sub-pixels, a plurality of third sub-pixels, a plurality of fourth sub-pixels, a plurality of fifth sub-pixels and a plurality of sixth sub-pixels, wherein the plurality of first sub-pixels, the plurality of second sub-pixels and the plurality of third sub-pixels are provided in a whole of the conventional display region respectively in a first density, a second density, and the second density, the plurality of fourth sub-pixels, the plurality of fifth sub-pixels and the plurality of sixth sub-pixels are provided in a whole of the translucent display region respectively in a third density, a fourth density, and the fourth density, each of the plurality of fourth sub-pixels has a same color as each of the plurality of first sub-pixels, each of the plurality of fifth sub-pixels has a same color as each of the plurality of second sub-pixels, and each of the plurality of sixth sub-pixels has a same color as each of the plurality of third sub-pixels; and wherein the first density is equal to the third density, and the second density is greater than the fourth density.

* * * * *